(12) United States Patent
Maki et al.

(10) Patent No.: US 11,353,902 B2
(45) Date of Patent: Jun. 7, 2022

(54) POWER CONTROL SEMICONDUCTOR DEVICE, VARIABLE OUTPUT VOLTAGE POWER SUPPLY, AND DESIGNING METHOD

(71) Applicants: Shinichiro Maki, Hiratsuka (JP); Yoichi Takano, Hadano (JP); Katsuhiro Yokoyama, Atsugi (JP)

(72) Inventors: Shinichiro Maki, Hiratsuka (JP); Yoichi Takano, Hadano (JP); Katsuhiro Yokoyama, Atsugi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 38 days.

(21) Appl. No.: 16/861,340

(22) Filed: Apr. 29, 2020

(65) Prior Publication Data

US 2020/0371538 A1 Nov. 26, 2020

(30) Foreign Application Priority Data

May 20, 2019 (JP) .............................. JP2019-094246

(51) Int. Cl.
*G05F 1/56* (2006.01)
*G06F 30/32* (2020.01)

(52) U.S. Cl.
CPC ................ *G05F 1/56* (2013.01); *G06F 30/32* (2020.01)

(58) Field of Classification Search
CPC ... H02M 3/156–158; G05F 3/26; H02P 7/285
See application file for complete search history.

(56) References Cited

U.S. PATENT DOCUMENTS

| | | | |
|---|---|---|---|
| 8,665,020 B2 | 3/2014 | Sakurai et al. |
| 8,786,317 B2 | 7/2014 | Terada et al. |
| 8,847,569 B2 | 9/2014 | Terada et al. |
| 9,606,556 B2 | 3/2017 | Takano et al. |
| 9,952,610 B1 | 4/2018 | Yokoyama et al. |
| 9,996,093 B2 | 6/2018 | Takano et al. |
| 10,063,135 B2 | 8/2018 | Maki et al. |
| 10,296,034 B2 | 5/2019 | Sakurai et al. |

(Continued)

FOREIGN PATENT DOCUMENTS

| | | |
|---|---|---|
| JP | H11265224 A | 9/1999 |
| JP | 2010055490 A | 3/2010 |

*Primary Examiner* — Thienvu V Tran
*Assistant Examiner* — Nusrat Quddus
(74) *Attorney, Agent, or Firm* — Holtz, Holtz & Volek PC (57) ABSTRACT

A power control semiconductor device includes: a voltage control transistor connected between an input terminal and an output terminal; a control circuit that controls the voltage control transistor in accordance with a voltage of the output terminal; and an external terminal that controls an output voltage externally. The control circuit includes: a first divider which has resistor elements connected in series to the output terminal and which divides the output voltage of the output terminal; a first error amplifier that outputs a voltage corresponding to a potential difference between a predetermined reference voltage and a voltage divided by the first divider; and an output voltage change circuit that changes the divided voltage in accordance with a voltage input to the external terminal to change the output voltage in accordance with the voltage of the external terminal.

7 Claims, 3 Drawing Sheets

(56) References Cited

U.S. PATENT DOCUMENTS

| | | |
|---|---|---|
| 10,466,728 B2 | 11/2019 | Maki et al. |
| 2013/0002220 A1* | 1/2013 | Terada ..................... G05F 1/56 323/282 |
| 2016/0299528 A1* | 10/2016 | Mori ..................... G06F 1/1637 |
| 2019/0302821 A1 | 10/2019 | Maki et al. |
| 2019/0393773 A1 | 12/2019 | Terada et al. |

* cited by examiner

POWER CONTROL SEMICONDUCTOR DEVICE, VARIABLE OUTPUT VOLTAGE POWER SUPPLY, AND DESIGNING METHOD

CROSS REFERENCE TO RELATED APPLICATION

This application is based upon and claims the benefit of priority under 35 USC 119 of Japanese Patent Application No. 2019-094246 filed on May 20, 2019, the entire disclosure of which, including the description, claims, drawings and abstract, is incorporated herein by reference in its entirety.

BACKGROUND OF THE INVENTION

1. Field of the Invention

The present invention relates to a power control semiconductor device of the series regulator type which linearly changes an output voltage with a control signal. The present invention also relates to a power supply, and a method of designing the power control semiconductor device.

2. Description of Related Art

A series regulator (hereinafter, abbreviated as "regulator") is one of power supplies that output a direct current voltage of a desired potential by controlling a transistor between a direct current voltage input terminal and an output terminal. The regulator is used for a constant voltage power supply (automotive regulator) that supplies direct current power to automotive electronics, such as a blower (fan), a light, and an audio equipment, which are mounted on a vehicle body.

Electronics such as a blower (fan) and a light sometimes need function of continuously changing air volume or brightness by linearly changing a voltage that drives a motor which rotates the fan or turns on the light. Therefore, the regulator needs function of linearly changing an output voltage.

Conventionally, for example, JP H11-265224A and JP 2010-055490A disclose an invention of a regulator that changes an output voltage.

The regulator described in JP H11-265224A switches an output voltage stepwise by switching a partial pressure ratio of a divider that divides the output voltage and generates a feedback signal. However, the regulator has problem that the output voltage cannot be changed linearly. The output voltage can be changed approximately linearly by increasing the number of series resistors and switch transistors that constitute the divider. However, it causes a problem that the number of elements is increased so that the elements occupy a larger area. It prevents miniaturization of a device.

The variable output voltage regulator described in JP 2010-055490A changes an output voltage linearly. However, since an external element of a regulator IC constitutes a circuit that adjusts an output voltage value, the number of components is large so that the components occupy a larger area. It prevents miniaturization of a device and increases power consumption. In addition, the output voltage varies depending on variation of a resist value of a resistor element for adjustment. It causes a problem that precision of the output voltage is lowered.

Figure 6:
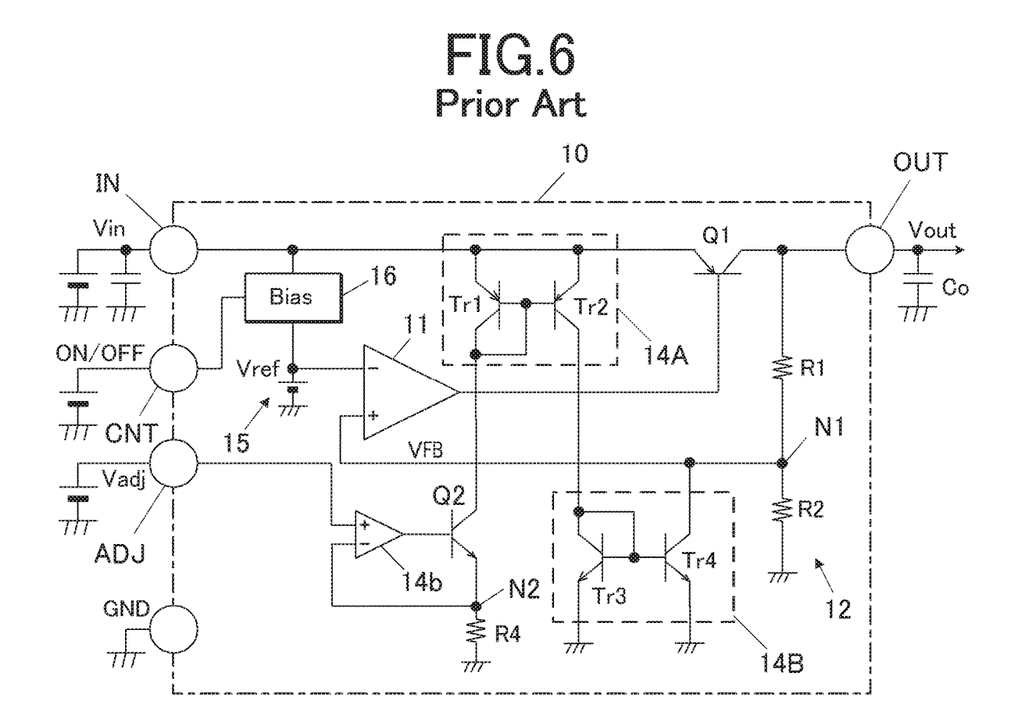
FIG. 6 is a circuit diagram showing an embodiment of a variable output voltage power supply according an invention of a preceding application.

The applicant made an invention relating to a power control semiconductor device and a variable output voltage power supply that linearly change an output voltage without increasing the number of elements or parts, and filed a patent application (Japanese Patent Application No. 2018-247303). FIG. 6 shows a circuit diagram of an embodiment of a power control semiconductor device according to the preceding application. In FIG. 6, the area surrounded by the chain line 10 is a circuit formed on a semiconductor substrate.

In a semiconductor integrated circuit (IC), a diffusion resistor consisting of a diffusion layer of predetermined impurity concentration formed in an island area surrounded by an insulator is commonly used as a resistor element that constitutes the circuit. In this IC in which the diffusion resistor is formed, for example, the island area is an n-type area while the diffusion resistor is a p-type area. In this case, a potential (island potential) like a power supply voltage, which is higher than voltage applied to the p-type diffusion resistor, is applied to the island area. Thus, the PN junction between the diffusion resistor and the island area is always reverse-biased. This is to prevent an undesired current from flowing into a parasitic element (PN junction).

According to the power control IC shown in FIG. 6, in a case in which resistors R1, R2 constituting a circuit that divides output voltage and a resistor R4 on the output side of an error amplifier 13 to which an output control signal Vadj is input are p-type diffusion resistors, an island area of the diffusion resistors of them is an n-type area. Therefore, in common designing methods, an output voltage Vout is applied as island potential of the resistors R1, R2. On the other hand, an island area of the resistor R4 is apart from an output terminal (output pad). Therefore, an emitter potential (or a source potential in a case in which Q2 is MOSFET) of a transistor Q2 with a relatively high potential in the vicinity of the island area of the resistor R4 may be selected as an island potential and be applied.

If the island potential fluctuates, thickness of depletion layer between the diffusion layer as a resistor and a semiconductor region of the island area changes. It is known that a diffusion resistor formed on a semiconductor substrate has bias dependence that a resistance value changes in accordance with the change in thickness of the depletion layer.

Specifically, according to the power control IC in FIG. 6, an output voltage Vout is changed in a range from Vref to Vin by setting resistance. Therefore, in a case in which the output voltage Vout is selected as the island potential of the resistors R1, R2 and the emitter potential of the transistor Q2 is selected as the island potential of the resistor R4, Vout varies in a range from 3.0V to 7.4V, for example, depending on set values of the resistors R1, R2, R4.

On the other hand, the control signal Vadj is often designed to vary in a range from 0V to 3.3V, which is a power supply voltage in control devices such as microcomputers that generate Vadj. As a result, the island potential of the resistor R4 varies in a range from 0V to 3.3V, which is the same as the range of the control signal Vadj. Thus, the fluctuation range of the island potential of the resistor R4 is 3.3V, which is narrower than the fluctuation range 4.4V of the island potential of the resistors R1, R2. A difference of 1.1V in the fluctuation range appears between the two island potentials. As a result, difference in change of resistance value due to bias dependence between the resistors R1, R2 and the resistor R4 is significantly large. It causes a problem that it reduces linearity of change in the output voltage Vout in relation to change in the control signal Vadj.

At first glance, it may be considered that the output voltage Vout should be selected as the island potential of the resistor R4 in the power control IC in FIG. 6. However, in a case in which a circuit is configured such that the output voltage Vout is applied to the island area of the resist R4, when a short circuit between the output terminal and the ground potential happens, 0V is applied to the island area of the resistor R4. A forward voltage is applied to a PN junction of the diffusion resistor, and an undesired current flows. In a case in which the control signal Vadj is input first and then the input voltage Vin is applied, a forward voltage is applied to a PN junction of the diffusion resistor R4 before the output voltage Vout reaches a target potential. Such configurations cannot be adopted.

It is also conceivable to select the input voltage Vin as the island potential of the resistor R4. However, in a case in which a circuit is configured such that the input voltage Vin is applied to the island area of the resistor R4, when the circuit is used in systems where the input voltage Vin is not stable, resistance values fluctuate in accordance with fluctuation in input voltage. In view of application like this, such configuration cannot be adopted.

SUMMARY OF THE INVENTION

The present invention was made in view of the above problems. An object of the present invention is to provide a power control semiconductor device which reduces difference in bias dependence between resistor elements constituting a circuit without causing malfunction in operation of the circuit. It improves linearity of change in an output voltage in relation to change in a control signal. Another object of the present invention is to provide a variable output voltage power supply using the power control semiconductor device.

To achieve at least one of the abovementioned objects, according to an aspect of the present invention, a power control semiconductor device includes:
  a voltage input terminal to which a direct current is input;
  an output terminal;
  a voltage control transistor connected between the voltage input terminal and the output terminal;
  a control circuit that controls the voltage control transistor in accordance with a voltage of the output terminal; and
  an external terminal that controls an output voltage externally,
  wherein
  the control circuit comprises:
  a first divider which has a first resistor element and a second resistor element that are connected in series to the output terminal and which divides the output voltage of the output terminal;
  a first error amplifier that outputs a voltage corresponding to a potential difference between a predetermined reference voltage and a voltage divided by the first divider; and
  an output voltage change circuit that changes the voltage which is divided by the first divider and which is input the first error amplifier in accordance with a voltage input to the external terminal to change the output voltage in accordance with the voltage of the external terminal,
  the output voltage change circuit comprises:
  a second error amplifier to which the voltage of the external terminal is input;
  a second transistor that includes a control terminal to which output of the second error amplifier is applied; and
  a third resistor element and a fourth resistor element that are connected in series with the second transistor, and a voltage of a connection node between the third resistor element and the fourth resistor element is negatively fed back to an input terminal of the second error amplifier.

According the power control semiconductor device having this configuration, an output control signal (Vadj) from an external device linearly changes an output voltage Preferably, each of the first resistor element and the second resistor element consists of a diffusion layer formed in a common first island area,
  the output voltage is applied as an island potential to the first island area,
  each of the third resistor element and the fourth resistor element consists of a diffusion layer formed in a common second island area, and
  a voltage of a connection node between the second transistor and the third resistor element is applied as an island potential to the second island area.

This configuration reduces difference in the fluctuation range of the island potential in accordance with fluctuation of the output control signal between a diffusion resistor-forming island of the first resistor element (R1) and the second resistor element (R2) and a diffusion resistor-forming island of the third resistor element (R3) and the fourth resistor element (R4). Thus, the above configuration improves linearity of change in the output voltage in relation to change in the output control signal.

Addition of just one resistor element generates the island potential of the diffusion resistor-forming island which is suitable for improving linearity of variable characteristics of the output voltage. Bias dependence of the diffusion resistor is optionally and easily corrected only by changing the resistance value of the added resistor element. Accidental short circuit between the output terminal and the ground point or fluctuation in the input voltage do not affect the island potential of the diffusion resistor-forming island of the third resistor element and the fourth resistor element. Thus, no malfunction occurs in operation of the circuit.

Preferably, the output voltage change circuit further includes:
  a first current mirror circuit which is connected to the voltage input terminal and which transfers a current flowing through the second transistor; and
  second current mirror circuit which is connected to the voltage input terminal and which turns a current flowing through the first current mirror circuit, and
  the current transferred by the second current mirror circuit is subtracted at a node from which the voltage divided by the first divider is extracted.

This configuration improves linearity of change in the output voltage in relation to change in the output control signal. Further, not only resistance values of the resistor elements constituting the output voltage change circuit but also the current ratio of the current mirror circuits can change the fluctuation range of the output voltage. This increases flexibility in design.

Preferably, the output voltage change circuit further includes a second divider which includes a fifth resistor element and a sixth resistor element that are connected in series to the external terminal and which divides a voltage input to the external terminal, and
  the voltage divided by the second divider is supplied to the second error amplifier.

This configuration linearly changes the output voltage by the voltage (the output control signal Vadj) input to the external terminal. Further, this configuration expands an input range of the output control signal Vadj by dividing the output control signal Vadj and inputting the result to the error amplifier.

According to another aspect of the present invention, a method of designing the power control semiconductor device having the above configuration includes:

determining a resistance value of the third resistor element to reduce difference in a fluctuation range between an island potential applied to the second island area and the output voltage that changes in accordance with the voltage of the external terminal.

This designing method facilitates designing of circuit constants for improving linearity of variable characteristics of the output voltage.

Preferably, the method further includes:

determining R1, R2, and R4 on an assumption that there is not the third resistor element; and determining R3 to satisfy an equation R3=R1−R4, where R1, R2, R3, and R4 are resistance values of the first resistor element, the second resist element, the third resistor element, and the fourth resistor element respectively.

This designing method allows easy calculation of the resistance value of the third resistor element suitable for reducing difference in the fluctuation range between the island potential applied to the second island area and the output voltage fluctuating in accordance with the voltage of the external terminal (ADJ or P1).

The power control semiconductor device and the variable output voltage power supply according to the inventions achieve effect of reducing difference in bias dependence between resistor elements constituting a circuit without causing malfunction in operation of the circuit. It improves linearity of change in an output voltage in relation to change in a control signal

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF EMBODIMENTS

Hereinafter, preferred embodiments of the present invention will be described with reference to the drawings.

First Embodiment

Figure 1:
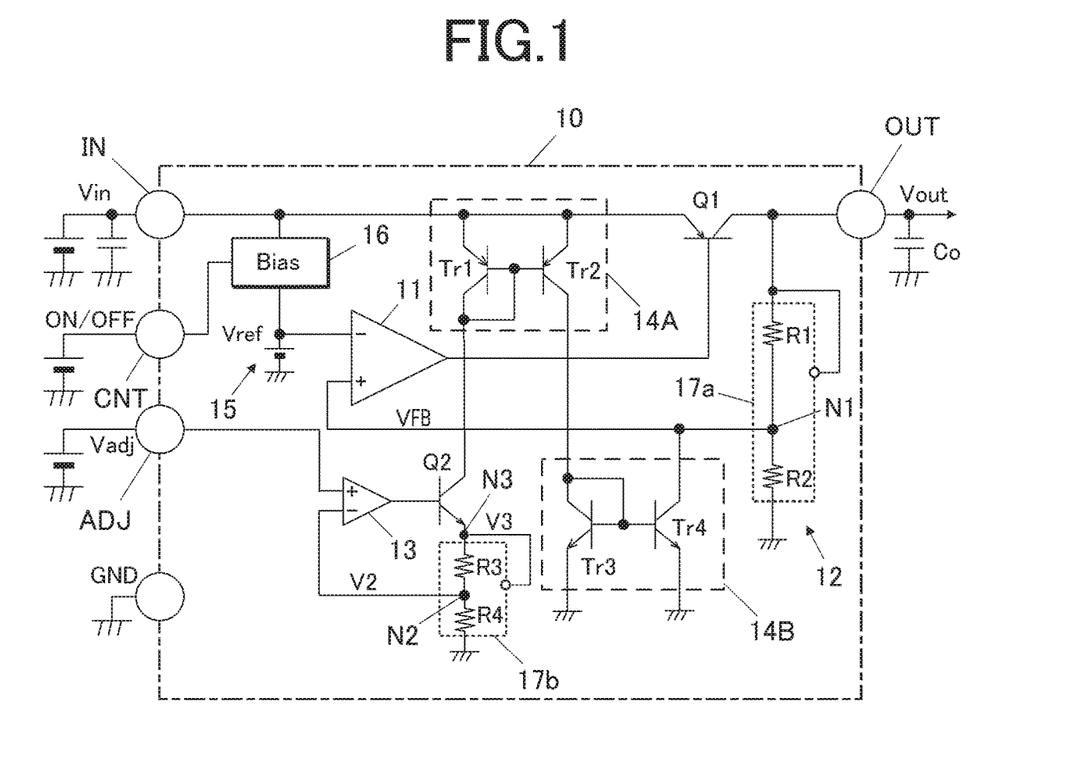
FIG. 1 is a circuit diagram showing a first embodiment of a power control semiconductor device of the series regulator type and a variable output voltage power supply according to the invention.

FIG. 1 shows a first embodiment of a series regulator as a variable output voltage power supply according to the invention. The portion surrounded by a chain line in FIG. 1 is formed as a semiconductor integrated circuit (regulator IC) 10 on a semiconductor chip, such as single crystal silicon. Capacitor Co is connected as an external element to the output terminal OUT of the regulator IC 10. Thus, the regulator IC 10 functions as a variable output voltage power supply that outputs a stable DC voltage to loads such as a motor and an LED lamp (not shown).

In the variable output voltage power supply of the embodiment, as shown in FIG. 1, a PNP bipolar transistor Q1 for voltage control (hereinafter referred to as "voltage control transistor") is connected between the output terminal OUT and the voltage input terminal IN to which a direct current input voltage yin of the regulator IC 10 is applied.

Resistors R1, R2 constituting a voltage divider 12 that divides an output voltage Vout are connected in series between the output terminal OUT and a ground line (ground point) to which a ground potential GND is applied.

Voltage of a connection node N1 between the resistors R1, R2 constituting the voltage divider 12 is input as a feedback voltage VFB to a non-inversion input terminal of an error amplifier 11 as an error amplification circuit that controls a gate terminal of the voltage control transistor Q1. The error amplifier 11 generates a voltage corresponding to a potential difference between the feedback voltage VFB of output and a predetermined reference voltage Vref, and supplies the generated voltage to a base terminal of the voltage control transistor Q1. Thus, the error amplifier 11 controls Q1 so that the output voltage Vout reaches a desired potential.

The regulator IC 10 of the embodiment is provided with an output control terminal ADJ as an external terminal to which a signal Vadj is input. The signal Vadj controls an output voltage Vout supplied from a microcomputer or the like (not shown).

The regulator IC 10 also includes:

a second error amplifier 13 that includes a non-inversion input terminal to which the output control signal Vadj applied to the terminal ADJ is input;

an NPN bipolar transistor Q2 that includes a bass terminal connected to an output terminal of the error amplifier 13; and resistors R3, R4 connected in series between the an emitter terminal and a ground point of the transistor Q2.

A voltage V2 of a connection node N2 between the resistors R3, R4 is input to an inversion input terminal of the error amplifier 13. Thereby negative feedback occurs in the error amplifier 13. The error amplifier 13 drives the transistor Q2 such that a current flows through the resistors R3, R4 in response to imaginary short-circuit operation such that the voltage V2 of the node N2 becomes the same as the voltage Vadj of the non-inversion input terminal.

The regulator IC 10 includes a first current mirror circuit 14A and a second current mirror circuit 14B. The first current mirror circuit 14A consists of PNP bipolar transistors Tr1, Tr2 having base terminals coupled to each other. Each of the PNP bipolar transistors Tr1, Tr2 has an emitter terminal connected to the input terminal IN. The second current mirror circuit 14B consists of NPN bipolar transistors Tr3, Tr4 having base terminals coupled to each other.

Each of the NPN bipolar transistors Tr3, Tr4 has an emitter terminal connected to a ground point.

The transistors Tr1, Tr3 function as a current-voltage converter when the base and collector terminals are coupled. When converted voltages are respectively applied to the transistors Tr2, Tr4, a current corresponding to the emitter size ratio of Tr1 to Tr2 and a current corresponding to the emitter size ratio of Tr3 to Tr4 respectively flow through the transistors Tr2, Tr4.

The resistors R3, R4 and the transistor Q2 driven by the error amplifier 13 are connected in series to the transistor Tr1 of the first current mirror circuit 14A. The collector terminal of the transistor Tr4 of the second current mirror circuit 14B is connected to the connection node N1 between the resistors R1 and R2 constituting the voltage divider 12. The feedback voltage VFB is changed by subtracting a current corresponding to the potential of the output control signal Vadj from the connection node N1. The changed feedback voltage VFB is input to the non-inversion input terminal of the error amplifier 11 controlling the base terminal of the voltage control transistor Q1.

Thus, the output voltage Vout corresponding to the output control signal Vadj is output to the output terminal OUT of the regulator IC 10. The error amplifier 13, the transistor Q2, the resistors R3, R4, and the current mirror circuits 14A, 14B constitute an output voltage change circuit that changes the output voltage Vout to a voltage corresponding to the output control signal Vadj.

The regulator IC 10 of the embodiment further includes:
a reference voltage supply 15 that generates the reference voltage Vref based on the input voltage Vin;
a bias circuit 16 that generates an operating current of the error amplifier 11; and
an on/off control terminal CNT as an external terminal to which a signal ON/OFF for turning on/off the bias circuit 16 is input.

When a on/off control signal ON/OFF of a low level (0V) is input to the on/off control terminal CNT, the bias circuit 16 stops supplying the operating current to the reference voltage supply 15 and the error amplifier 11. Thus, the bias circuit 16 stops operation of these circuits.

In the regulator IC 10 of the embodiment, each of the resistors R1, R2 constituting the voltage divider 12 is formed as a diffusion resistor in a common island area 17a surrounded by an insulator on a surface of a semiconductor substrate. Wiring is formed such that the voltage Vout of the output terminal OUT is applied to the island area 17a.

On the other hand, each of the resistors R3, R4 connected in series between the emitter terminal and the ground point of the transistor Q2 is also formed as a diffusion resistor in a common island area 17b surrounded by an insulator on the surface of the semiconductor substrate. Wiring is formed such that a voltage V3 of a connection node N3 between the emitter terminal of Q2 and the resistor R3 is applied to the island area 17b.

The diffusion resistors formed in the island areas 17a, 17b surrounded by the insulators have the same structure as, for example, common diffusion resistors formed through common bipolar semiconductor processes.

Specifically, an element to be used may have a structure in which:
an embedded layer is formed below an island area that is element-separated by trench isolation;
a diffusion layer is formed on the surface of the island area above the embedded layer; and
electrodes are formed at both ends of the diffusion layer.

According to the variable output voltage power supply of the embodiment, in a case in which the current ratio of each of the current mirror circuits 14A, 14B is set at 1:1, the output voltage Vout is represented by the following.

$$Vout = ((R2+R1)/R2) * Vref - (Vadj/R4) * R1 \quad (1)$$

Thus, the variable output voltage power supply of the embodiment sets various output voltages by applying various voltages (the control signal Vadj) to the output control terminal ADJ. Further, the variable output voltage power supply linearly changes the output voltage Vout with the voltage applied to the output control terminal ADJ.

Figure 2:
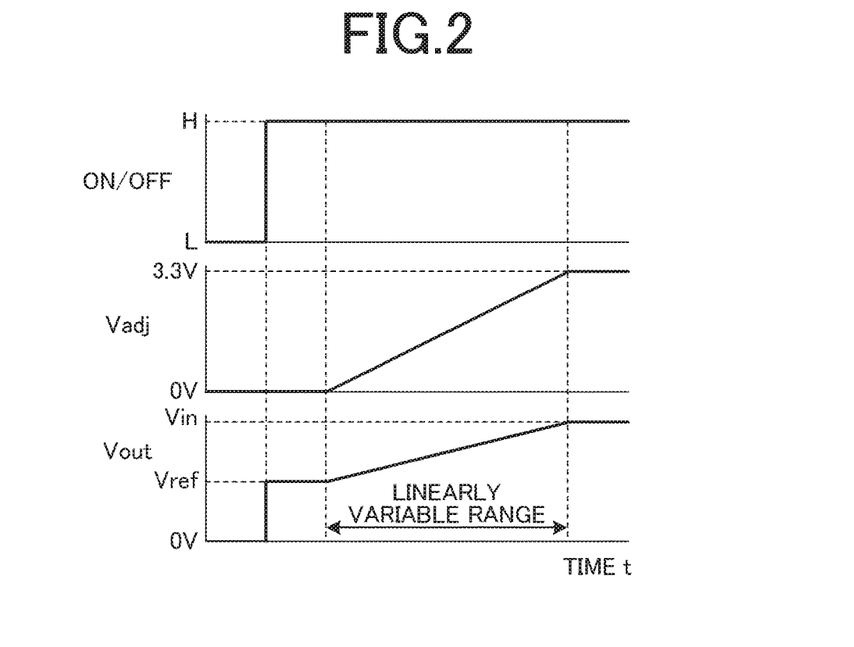
FIG. 2 is a waveform diagram showing relation of an on/off control signal ON/OFF, an output control signal Vadj, and an output voltage Vout in a regulator of the first embodiment.

Specifically, FIG. 2 shows relation between the input signal ON/OFF to the on/off control terminal CNT, the control signal Vadj input to the output control terminal ADJ, and the output voltage Vout in the variable output voltage power supply of the embodiment.

FIG. 2 shows that the output voltage Vout is changed in the range of Vref to Vin by changing the control signal Vadj in the range of, for example, 0V to 3.3V. The range of 0V to 3.3V in which the control signal Vadj is changed is just one example, and the range is not limited thereto.

In Equation (1) representing the output voltage Vout, (Vadj/R4)*R1 in the second term on the right side shows a fluctuation range of the output voltage changed by the control signal Vadj. On the other hand, the voltage V3 of the node N3 is represented by the following.

$$V3 = Vadj * (R3/R4) \quad (2)$$

The value of the resistor R3 is set such that the second term in Equation (1) equals Equation (2). Thereby the resistors R3, R4 are affected to the same extent as the resistors R1, R2 by bias dependence of the resistance value according to the island potential. This suppresses decrease in relative precision of the resistance value of the resistors R3, R4 with respect to the resistance value of the resistors R1, R2 which changes with change in the control signal Vadj.

Specifically, the following is obtained by considering that the second term of Equation (1) equals Equation (2).

$$(Vadj/R4)*R1 = Vadj*(R3/R4) \quad (3)$$

This equation is summarized as follows.

$$R3 = R1 - R4 \quad (4)$$

The resistance value of R3 is set so as to satisfy Equation (4). This suppresses decrease in relative precision of the resistance value of the resistors R3, R4 with respect to the resistance value of the resistors R1, R2 which changes with change in the island potential.

Vout' is represented by the following, where Vout is output when Vadj is 0V, and Vout' is output when Vadj is applied.

$$Vout' = Vout(Vadj \times \text{variable coefficient})$$

Figure 3:
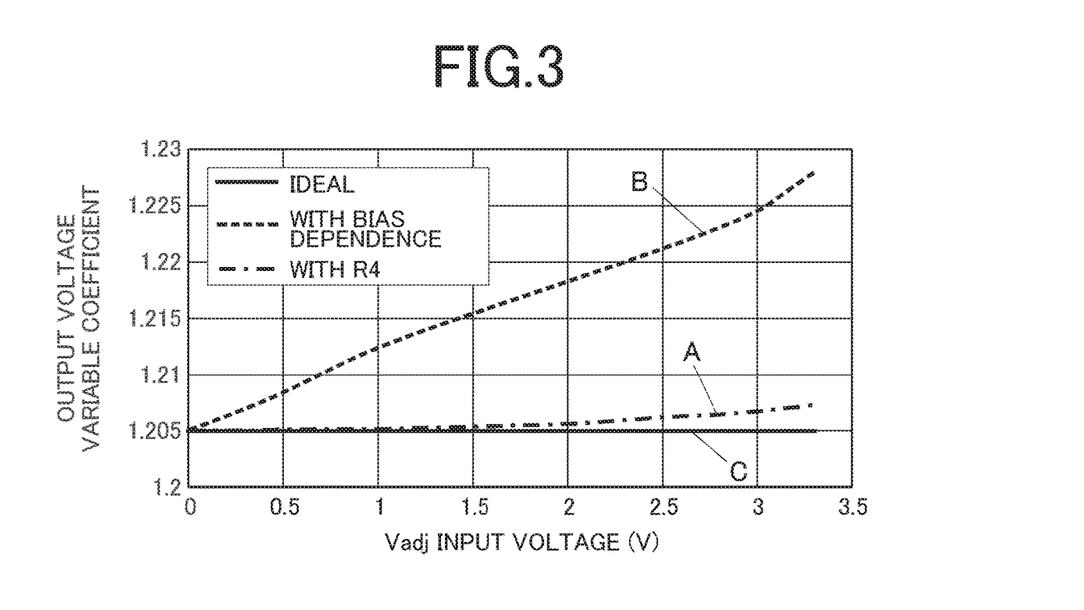
FIG. 3 is a graph showing relation between the output control signal Vadj and an inclination of an output voltage fluctuation range (output voltage variable coefficient) in the regulator f the first embodiment.

The variable coefficient is inclination of the output voltage fluctuation range. The chain line in FIG. 3 is drawn by plotting the variable coefficient for the control signal Vadj in a case in which the resistor R3 is provided and the resistance value of R3 is set so as to satisfy Equation (4). For comparative purposes, the broken line B shows relation between the control signal Vadj and the output voltage variable coefficient in a circuit without the resistor R3 (see FIG. 6). The solid line C shows ideal characteristics of the output voltage variable coefficient for the control signal Vadj.

FIG. 3 shows that change in the output voltage variable coefficient in response to change in the control signal Vadj is reduced by setting the value of the resistor R3 so as to satisfy Equation (4) and by applying the voltage V3 of the connection node N3 between the emitter of the transistor Q2 and the resistor R3 to the common island area 17b of the resistors R3, R4. It improves linearity of change in the output voltage Vout.

In the embodiment, not only the value of the resistor R4 but also the current ratio of the current mirror circuits 14A, 14B changes the range in which the output voltage Vout changes. It brings advantage that flexibility of design is increased.

In addition, the output control signal Vadj from the outside linearly changes the output voltage. Further, the output voltage Vout is changed by sending a current that is converted from a voltage by the error amplifier 13 to the resistor R1. It realizes a variable output voltage power supply that is unlikely to be affected by power supply noise.

Modification

Figure 4:
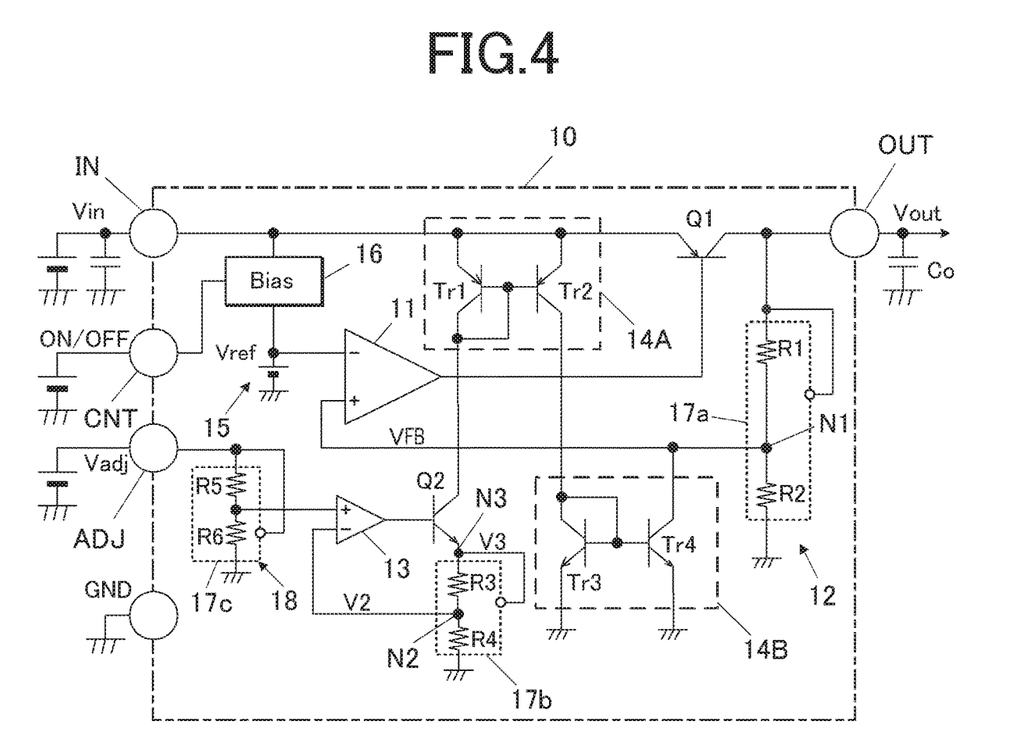
FIG. 4 is a circuit diagram showing a modification of the variable output voltage power supply of the first embodiment.

FIG. 4 is a modification of the variable output voltage power supply of the first embodiment in FIG. 1. In the modification, a divider 18 consisting of resistors R5, R6 in series which divide the output control signal Vadj is provided between a ground point and the output control terminal ADJ to which the output control signal Vadj supplied from a microcomputer or the like is input. Each of the resistors R5, R6 constituting the divider 18 is also formed as a diffusion layer in a common island area 17c. The voltage Vadj of the external terminal ADJ is applied as island potential to the island area 17c. Like the first embodiment, it suppresses decrease in relative precision of the resistance values of R5 and R6 due to bias dependence.

In the regulator IC of the first embodiment in FIG. 1, the error amplifier 13 has a gain since the resistor R3 is provided. Like the modification in FIG. 4, the divider 18 divides the output control signal Vadj and inputs the result to the error amplifier 13. The resistor R3 adjusts the gain of the error amplifier 13 to align the fluctuation range of the island potential of the island areas 17a, 17b. This suppresses decrease in relative precision of the resistance value of R3 and R4 with respect to the resistance value of R1 and R2 which changes with change in the island potential. An input range of Vadj is expanded by dividing the output control signal Vadj and inputting the result to the error amplifier 13.

The current mirror circuits 14A, 14B in FIG. 1 and FIG. 4 are not limited to the configuration shown in the figures, but may be of other circuit types, such as Wilson type and the base current compensating type.

Second Embodiment

Figure 5:
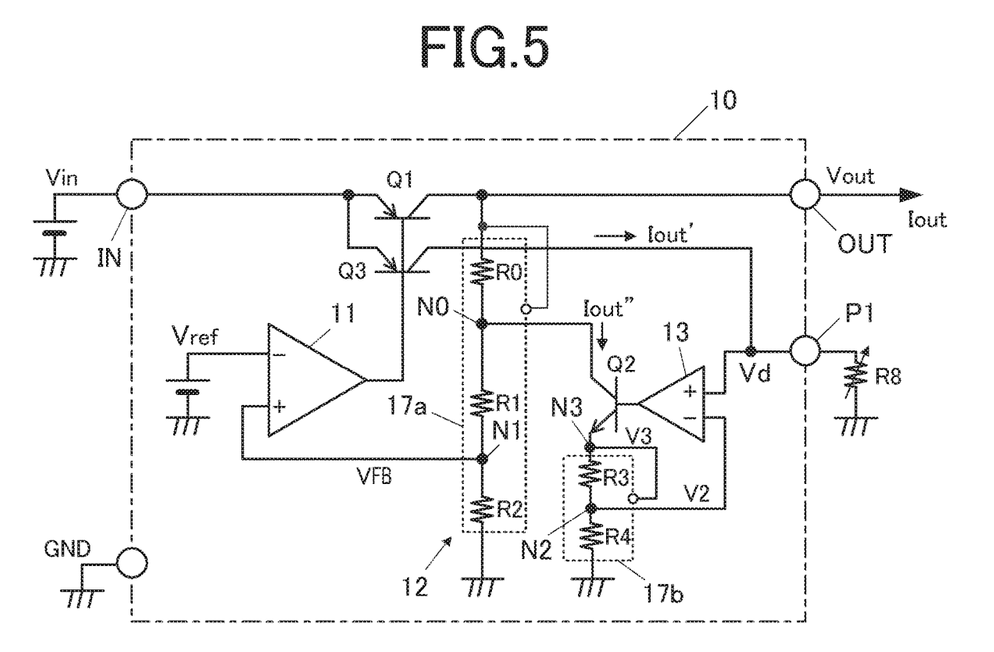
FIG. 5 is a circuit diagram showing a second embodiment of the variable output voltage power supply according to the invention.

FIG. 5 shows a second embodiment of the series regulator as the variable output voltage power supply according to the present invention.

According to the variable output voltage power supply of the embodiment, a voltage control transistor Q1 consisting of a PNP bipolar transistor is connected between an output terminal OUT and a voltage input terminal IN of a regulator IC 10 to which a direct current voltage Vin is applied. Resistors R0, R1, and R2 constituting a voltage divider 12 that divides the output voltage Vout are connected in series between the output terminal OUT and a ground line to which a ground potential GND is applied.

A voltage of a connection node N1 between the resistors R1, R2 constituting the voltage divider 12 is input as a feedback voltage VFB to a non-inversion input terminal of the error amplifier 11 as an error amplification circuit that controls a base terminal of the voltage control transistor Q1.

The error amplifier 11 generates a voltage corresponding to a potential difference between the output feedback voltage VFB and a predetermined reference voltage Vref. The error amplifier 11 supplies the voltage to the base terminal of the voltage control transistor Q1 to control Q1. Thus, the error amplifier 11 controls the output voltage Vout to equal a desired potential.

According to the regulator IC 10 of the embodiment, a bipolar transistor Q3 is connected in parallel with the voltage control transistor Q1. The voltage control transistor Q1 and the bipolar transistor Q3 constitutes a current mirror circuit. A voltage identical to the voltage applied to the base terminal of the voltage control transistor Q1 is applied to a base terminal as a control terminal of the transistor Q3. Thus, a current (1/n current) proportional to a collector current of Q1 flows through Q3, where "n" is the current mirror ratio of the transistors Q1, Q3.

The regulator IC 10 is provided with an external terminal P1 connected to a resistor R8. The resistor R8 is connected in series with the current mirror transistor Q3 between the voltage input terminal IN and a ground potential point outside the tip. The resistor R8 converts a collector current of Q3 into a voltage.

In addition, the regulator IC 10 is provided with an error amplifier 13 that includes a non-inversion input terminal connected to the external terminal P1. An NPN bipolar transistor Q2 and resistors R3, R4 are connected in series between a grounding point inside the tip and a connection node N0 between the resistors R0, R1 constituting the voltage divider 12.

An output terminal of the error amplifier 13 is connected to a base terminal of the transistor Q2. An inversion input terminal of the error amplifier 13 is connected to a connection node N2 between the resistors R3, R4. Thereby the error amplifier 13 operates the transistor Q2 such that a voltage V2 of the connection node N2 equals an input voltage of the non-inversion input terminal (potential of the external terminal P1). A resistor R8 connected to the external terminal P1 is constituted by a variable resistor.

The output voltage Vout is changed by changing the resistance value of the resistor R8.

A collector current of the voltage control transistor Q1, i.e., a current Iout' proportional to a current Iout in the output terminal OUT flows through the current mirror transistor Q3. The current is converted into a voltage by the external resistor R8 and is then input to the non-inversion input terminal of the error amplifier 13. Thus, the current Iout" proportional to the output current Iout flows through the transistor Q2. Then, this current Iout" is subtracted from the resistor R0 constituting the voltage divider 12. Therefore, a potential of the non-inversion input terminal of the error amplifier 11 changes according to the resistance value of the external resistor R8. A voltage of the voltage control transistor Q1 controlled by the error amplifier 11 changes so that the output voltage Vout changes.

According to the embodiment, the output voltage Vout is applied as an island potential to a common island area 17a of the resistors R0, R1, R2. A voltage V3 of a connection node N3 between the resistor R3 and an emitter terminal of the transistor Q2 is applied as island potential to a common island area 17b of the resistors R3, R4. Thereby the resistors R3, R4 are affected to the same extent as the resistors R0, R1, R2 by bias dependence of the resistance value according to the island potential. This suppresses decrease in relative precision of the resistance value of the resistors R3, R4 with respect to the resistance value of the resistors R1, R2 which changes with change in the island potential.

The invention made by the present inventor has been described above in detail based on the examples, but the present invention is not limited to the above examples. For example, the regulator IC 10 of the first embodiment is provided with the on/off control terminal CNT that inputs a ON/OFF signal for stopping operation of the IC. This on/off control terminal CNT may be omitted. In a case in which the on/off control terminal CNT is omitted, the regulator IC 10 may consist of four terminals. It reduces the cost and saves space through miniaturization.

In the first and second embodiments, the regulator IC 10 is constituted by bipolar transistors. Alternatively, the regulator IC 10 may be constituted by a MOS transistor (p-channel and n-channel).

In the above embodiment, the present invention is applied to a variable output voltage power supply of the series regulator type. However, the present invention may be used in a power supply of the shunt regulator type.

What is claimed is:

1. A power control semiconductor device, comprising:
    a voltage input terminal to which a direct current is input;
    an output terminal;
    a voltage control transistor which is connected between the voltage input terminal and the output terminal and which includes a control terminal;
    a control circuit that controls the voltage control transistor in accordance with a voltage of the output terminal; and
    an external terminal that controls an output voltage externally,
    wherein:
    the control circuit comprises:
        a first divider which has a first resistor element and a second resistor element that are connected in series to the output terminal and which divides the output voltage of the output terminal;
        a first error amplifier that applies, to the control terminal of the voltage control transistor, a voltage corresponding to a potential difference between a predetermined reference voltage and a voltage divided by the first divider; and
        an output voltage change circuit that changes the voltage which is divided by the first divider and which is input to the first error amplifier in accordance with a voltage of the external terminal to change the output voltage in accordance with the voltage of the external terminal,
    the output voltage change circuit comprises:
        a second error amplifier to which the voltage of the external terminal is input;
        a second transistor that includes a control terminal to which output of the second error amplifier is applied; and
        a third resistor element and a fourth resistor element that are connected in series with the second transistor,
    a voltage of a connection node between the third resistor element and the fourth resistor element is negatively fed back to an input terminal of the second error amplifier,
    each of the third resistor element and the fourth resistor element consists of a diffusion layer formed in a first common island area, and
    a voltage of a connection node between the second transistor and the third resistor element is applied as an island potential to the first common island area.

2. The power control semiconductor device according to claim 1, wherein:
    each of the first resistor element and the second resistor element consists of a diffusion layer formed in a second common island area, and
    the output voltage is applied as an island potential to the second common island area.

3. The power control semiconductor device according to claim 2, wherein:
    the output voltage change circuit further comprises:
        a first current mirror circuit which is connected to the voltage input terminal and which transfers a current flowing through the second transistor; and
        a second current mirror circuit which is connected to the voltage input terminal and which turns a current flowing through the first current mirror circuit, and
    the current transferred by the second current mirror circuit is subtracted at a node from which the voltage divided by the first divider is extracted.

4. The power control semiconductor device according to claim 3, wherein:
    the output voltage change circuit further comprises a second divider which includes a fifth resistor element and a sixth resistor element that are connected in series to the external terminal and which divides a voltage input to the external terminal, and
    the voltage divided by the second divider is supplied to the second error amplifier.

5. A variable output voltage power supply, comprising:
    the power control semiconductor device according to claim 1; and
    an external capacitor connected to the output terminal of the power control semiconductor device.

6. A method of designing the power control semiconductor device according to claim 1, comprising:
    determining a resistance value of the third resistor element to reduce difference in a fluctuation range between an island potential applied to the first common island area and the output voltage that changes in accordance with the voltage of the external terminal.

7. The power control semiconductor device according to claim 1, wherein:
    a resistance value R1 of the first resistor element, a resistance value R2 of the second resistor element, and a resistance value R4 of the fourth resistor element are determined based on a set value of the output voltage of the output terminal, and
    a resistance value R3 of the third resistor element is determined to satisfy an equation R3=R1−R4.

* * * * *

UNITED STATES PATENT AND TRADEMARK OFFICE
CERTIFICATE OF CORRECTION

PATENT NO. : 11,353,902 B2
APPLICATION NO. : 16/861340
DATED : June 7, 2022
INVENTOR(S) : Shinichiro Maki, Yoichi Takano and Katsuhiro Yokoyama It is certified that error appears in the above-identified patent and that said Letters Patent is hereby corrected as shown below:

In the Specification

Column 1, Line 14, delete "has" and insert -- has a --.
Column 1, Line 62, delete "resist" and insert -- resistor --.
Column 2, Line 34, delete "of" and insert -- of a --.
Column 2, Line 67, delete "resist" and insert -- resistor --.
Column 3, Line 55, delete "input" and insert -- input to --.
Column 4, Line 4, delete "According" and insert -- According to --.
Column 4, Line 6, delete "voltage" and insert -- voltage. --.
Column 4, Line 45, delete "second" and insert -- a second --.
Column 5, Line 21, delete "resist" and insert -- resistor --.
Column 5, Line 36, after "signal" insert -- . --.
Column 5, Line 58, delete "f" and insert -- of --.
Column 5, Line 66, delete "according" and insert -- according to --.
Column 6, Line 23, delete "yin" and insert -- Vin --.
Column 8, Line 5, delete "Vout=((R2+R1)/R2)*Vref(Vadj/R4)*R1" and insert -- Vout=((R2+R1)/R2)*Vref+(Vadj/R4)*R1 --.
Column 8, Line 51, delete "Vout'=Vout(Vadj×variable coefficient)" and insert -- Vout'=Vout+(Vadj×variable coefficient) --.
Column 8, Line 54, delete "line" and insert -- line A --.

Signed and Sealed this
Twentieth Day of December, 2022

Katherine Kelly Vidal
*Director of the United States Patent and Trademark Office*